(12) United States Patent
Camardello et al.

(10) Patent No.: US 9,605,199 B1
(45) Date of Patent: Mar. 28, 2017

(54) OXY-BROMIDE PHOSPHORS AND USES THEREOF

(71) Applicant: GENERAL ELECTRIC COMPANY, Schenectady, NY (US)

(72) Inventors: Sam Joseph Camardello, Ballston Spa, NY (US); Alok Mani Srivastava, Niskayuna, NY (US); Holly Ann Comanzo, Niskayuna, NY (US); William Winder Beers, Chesterland, OH (US); Fangming Du, Hudson, OH (US); William Erwin Cohen, Solon, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 15/086,699

(22) Filed: Mar. 31, 2016

(51) Int. Cl.
| | |
|---|---|
| *C09K 11/61* | (2006.01) |
| *C09K 11/77* | (2006.01) |
| *H01L 33/50* | (2010.01) |
| *C09K 11/59* | (2006.01) |
| *C09K 11/08* | (2006.01) |
| *H01L 33/14* | (2010.01) |
| *H01L 33/54* | (2010.01) |

(52) U.S. Cl.
CPC ............ *C09K 11/61* (2013.01); *C09K 11/08* (2013.01); *C09K 11/59* (2013.01); *C09K 11/77* (2013.01); *C09K 11/7728* (2013.01); *C09K 11/7734* (2013.01); *H01L 33/502* (2013.01); *H01L 33/507* (2013.01); *H01L 33/14* (2013.01); *H01L 33/54* (2013.01)

(58) Field of Classification Search
CPC ......... C09K 11/00; C09K 11/08; C09K 11/59; C09K 11/61; C09K 11/71; C09K 11/72; C09K 11/77; C09K 11/7728; H01L 33/50; H01L 33/501; H01L 33/502

See application file for complete search history.

(56) References Cited

U.S. PATENT DOCUMENTS

| | | | |
|---|---|---|---|
| 2007/0125982 A1 | 6/2007 | Tian et al. | |
| 2016/0168457 A1* | 6/2016 | Camardello | C09K 11/617 349/71 |
| 2016/0172549 A1* | 6/2016 | Srivastava | H01L 33/504 257/98 |

FOREIGN PATENT DOCUMENTS

WO WO2008042740 A1 4/2008

OTHER PUBLICATIONS

Xia et al., "Crystal growth of Ca3SiO4Br2: New photoluminescence bromosilicate host", Journal of Crystal Growth, Feb. 2011; 318(1), pp. 958-961.

(Continued)

*Primary Examiner* — Eduardo A Rodela
(74) *Attorney, Agent, or Firm* — Mary Lousie Stanford

(57) ABSTRACT

Blue and green-emitting $Eu^{2+}$-activated oxyhalide phosphors of formula A-E may be used in devices for lighting or display applications:
A. $M_3SiO_3X_4:Eu^{2+}$;
B. $M_5Si_3O_9X_4:Eu^{2+}$;
C. $M_{1.64}Si_{0.82}O_{3.1}X_{0.36}:Eu^{2+}$;
D. $M_{10}Si_3O_9X_{14}:Eu^{2+}$;
E. $M_2SiO_3X_2:Eu^{2+}$; and
wherein
M is Ba, Ca, Sr, or a mixture thereof;
X is Cl or Br, or a mixture thereof.

21 Claims, 6 Drawing Sheets

(56) References Cited

OTHER PUBLICATIONS

Xia et al., "Synthesis, structure and Eu2+-doped luminescence properties of bromosilicate compound Ca3SiO4Br2", Journal of Luminescence, Feb. 2013; vol. 134, pp. 227-231.
Sun et al., "Luminescent and thermal properties of a new green emitting Ca6Sr4(Si2O7)3Cl2:Eu2+ phosphor for near-UV light-emitting diodes", Materials Research Bulletin, Jan. 2012; vol. 47 Issue 2, pp. 400-404.
Li et al., "Synthesis and luminescence properties of green phosphors Ca6Sr4(Si2O7)3Cl2:Eu2+ for white light emitting diodes", Journal of Luminescence, May 2012; vol. 132 Issue 6, pp. 1497-1500.
Wang et al., "Preparation and luminescence characteristics of Eu-doped calcium chloride silicate Ca7Si2O8Cl6", Journal of Alloys and Compounds, May 2014; vol. 589 Issue 15, pp. 120-124.
Xia et al., "Synthesis and calcination temperature dependent photoluminescence properties of novel bromosilicate phosphors", Materials Letters, Dec. 2009; vol. 63 Issue 29, pp. 2600-2602.
Wang et al., "The composition, luminescence, and structure of Sr8[Si4O12]Cl8:Eu21+", Materials Research Bulletin, 2001; vol. 36, pp. 2051-2057.

\* cited by examiner

OXY-BROMIDE PHOSPHORS AND USES THEREOF

BACKGROUND

Light-emitting devices based on a combination of a semiconductor light-emitting element and a phosphor have attracted attention for next-generation devices where low energy consumption, compact size, high brightness and wide color gamut are expected. Further, in recent years, development of a backlight for a small-sized liquid crystal display has become more competitive. In this field, various methods have been proposed, however, a method that can provide both brightness and color gamut (NTSC ratio) has not been found yet. Currently, a combination of a blue light-emitting element (peak wavelength: about 450 nm), and a $(Y,Gd)_3(Al, Ga)_5O_{12}$ phosphor activated with trivalent cerium that is excited by the blue light and exhibits yellow light emission or a $(Sr,Ba,Ca)_2SiO_4$ phosphor activated with divalent europium is mainly used. However, in such a light-emitting device, color gamut (NTSC ratio) is typically about 65% (CIE1931), while even in a small-sized LCD, higher color gamut is demanded. Under such a background, there is an urgent need to improve the color gamut (NTSC ratio) of a backlight for a small-sized LCD. Accordingly, there is also a need for phosphor compositions and blends that efficiently absorb blue radiation, provide high quantum efficiency, and result in improved color rendering in white light emitting lighting devices.

BRIEF DESCRIPTION

Briefly, in one aspect, the present invention relates to blue and green-emitting $Eu^{2+}$-activated oxyhalide phosphors of formula A-E A. $M_3SiO_3X_4$:$Eu^{2+}$;
B. $M_5Si_3O_9X_4$:$Eu^{2+}$;
C. $M_{1.64}Si_{0.82}O_{3.1}X_{0.36}$:$Eu^{2+}$;
D. $M_{10}Si_3O_9X_{14}$:$Eu^{2+}$;
E. $M_2SiO_3X_2$:$Eu^{2+}$; and
wherein
M is Ba, Ca, Sr, or a mixture thereof;
X is Cl or Br, or a mixture thereof.

In another aspect, the present invention relates to devices that include a semiconductor light source radiationally coupled to a $Eu^{2+}$ activated phosphor selected from phosphors of formula A-E. The devices may be configured for lighting or display applications.

DRAWINGS

These and other features, aspects, and advantages of the present invention will become better understood when the following detailed description is read with reference to the accompanying drawings in which like characters represent like parts throughout the drawings, wherein.

Figure 6:
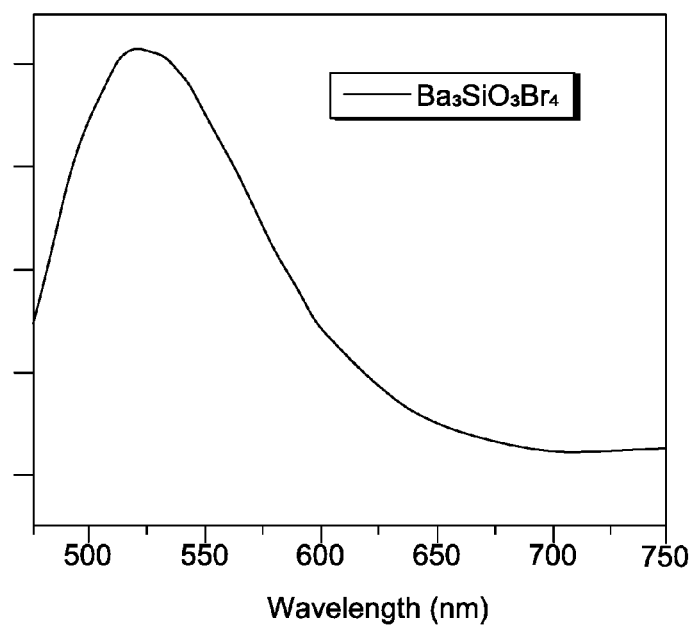
Figure 7:
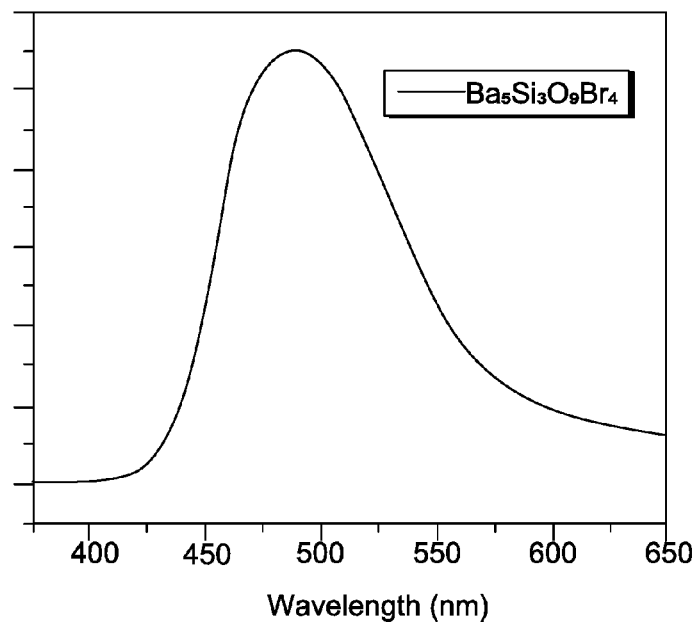
Figure 8:
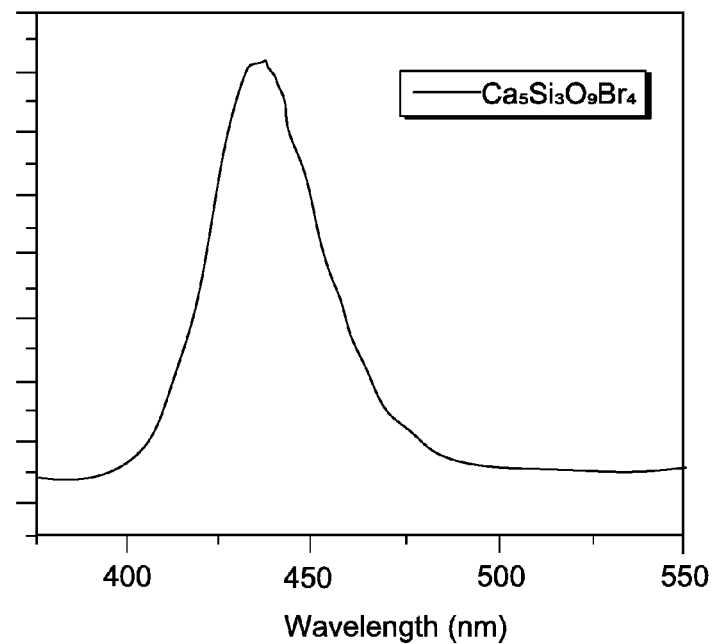
Figure 9:
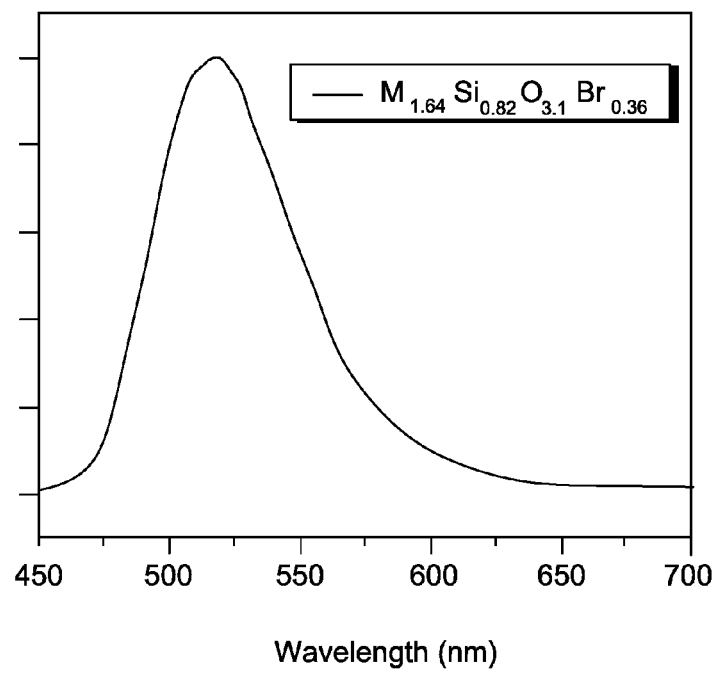
Figure 10:
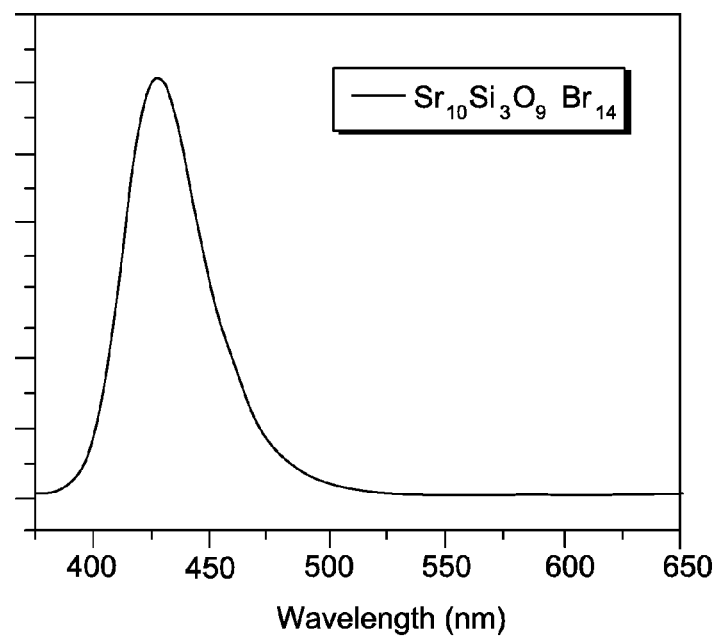
Figure 11:
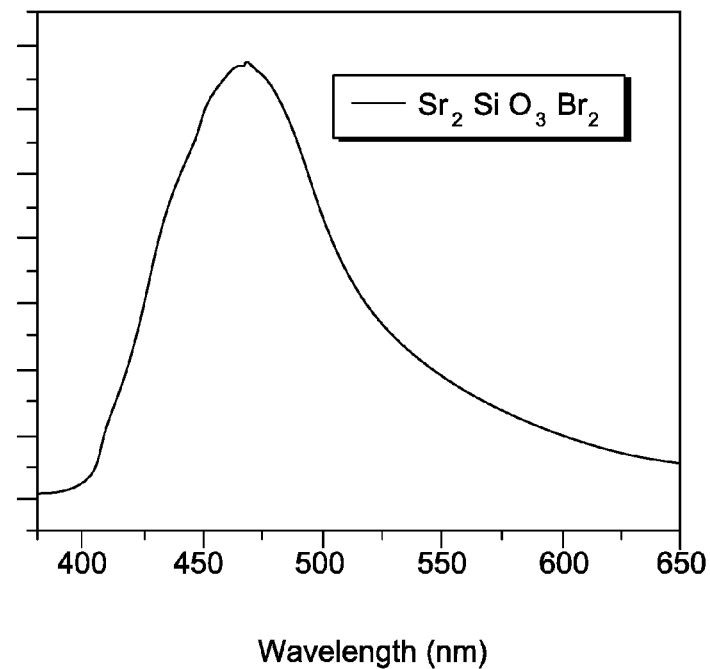

FIG. 6 is an emission spectrum of a green emitting oxybromide phosphor of formula A, where M=Ba and X=Br FIG. 7 is an emission spectrum of a blue emitting oxybromide phosphor of formula B, where M=Ba and X=Br FIG. 8 is an emission spectrum of a blue emitting oxybromide phosphor of formula B, where M=Ca and X=Br FIG. 9 is an emission spectrum of a green emitting oxybromide phosphor of formula C, where M=Ba/Sr and X=Br FIG. 10 is an emission spectrum of a blue emitting oxybromide phosphor of formula D, where M=Sr and X=Br FIG. 11 is an emission spectrum of a blue emitting oxybromide phosphor formula E, where M=Sr and X=Br

DETAILED DESCRIPTION

The blue and green-emitting $Eu^{2+}$-activated oxyhalide phosphors according to the present invention have high quantum efficiency and desirable spectral characteristics as down converting phosphors. The phosphors may be used as a down converting phosphors for LED applications, which applications vary depending on the spectral characteristics. Narrow blue phosphors have applications in 405 nm LED packages, where the blue component of the white light is missing because of the lack of a 450 nm emitter. Narrow band green phosphors have applications in high gamut LCD BLU's or achieving desired effects on CRI or LPW when mixed in the proper ratio with other known LED phosphors.

The halide ion, X in formulas A-E, may be Cl or Br or a mixture thereof; in preferred embodiments, the halide ion is Br. The metal ion M may be Ba, Ca, Sr, or a mixture thereof, in preferred embodiments, the metal ion is Ba, Sr or Ca. The phosphors are activated or doped with $Eu^{2+}$ ions, and additional activator ions may be present. Examples of additional activator ions include $Mn^{2+}$, $Mn^{4+}$, $Ce^{3+}$, $Sn^{2+}$, $Bi^{3+}$, $Sb^{3+}$, $Cr^{3+}$, $Tb^{3+}$, $Pr^{3+}$, $Eu^{3+}$, $Ti^{4+}$, $In^+$, $Tl^+$, $Dy^{3+}$ and $Pb^{2+}$.

In particular embodiments, the phosphor is $Ba_3SiO_3Br_4$:$Eu^{2+}$; $Ba_5Si_3O_9Br_4$:$Eu^{2+}$; $Ca_5Si_3O_9Br_4$:$Eu^{2+}$; $M_{1.64}Si_{0.82}O_{3.1}Br_{0.36}$:$Eu^{2+}$, where M is 60:40 Ba:Sr; $Sr_{10}Si_3O_9Br_{14}$:$Eu^{2+}$ or $Sr_2SiO_3Br_2$:$Eu^{2+}$.

The phosphors may be produced by known methods for producing oxyhalide phosphors. In some embodiments, a mixture of raw materials in solid form may be fired under a reducing atmosphere. In particular, a $Eu^{2+}$ activated phosphor may be produced by combining from about 3.2 parts to about 3.4 parts $BaCO_3$,
from about 1.5 to about 1.7 parts $SrCO_3$,
from about 0.87 to about 0.89 parts $SiO_2$,
from about 0.02 to about 0.15 parts $Eu_2O_3$ and
from about 0.54 to about 0.62 parts $NH_4Br$.

In a first firing step, the combination of the $BaCO_3$, $SrCO_3$, $SiO_2$, $Eu_2O_3$ and $NH_4Br$ raw materials is fired at a temperature ranging from about 800° C. to about 1300° C. under a reducing atmosphere to form an intermediate product. Then, in a second firing step, the intermediate product is fired at a temperature ranging from about 800° C. to about 1300° C. under the reducing atmosphere. The reducing atmosphere may be composed of 0.5% $H_2$ and 99.5% $N_2$. The materials may be cooled to ambient temperature between the two firing steps. In particular embodiments, the temperature of the first and second firing steps is about 1100° C. The composition of the resulting $Eu^{2+}$ activated phosphor may be expressed as $M_{1.64}Si_{0.82}O_{3.1}Br_{0.36}$:$Eu^{2+}$: (M=60:40Ba:Sr) or as
$M_2SiO_{4-0.5x}Br_x$ where M=60:40 Ba:Sr and x is 0.44 or as
$(1-x)M_2SiO_4+xM_2SiO_3Br_2$ where M=60:40 Ba:Sr and x is 0.22 or as (1−2x)M$_2$SiO$_4$+xMSiO$_3$+xMBr$_2$ where M=60:40 Ba:Sr and x is 0.18.

Figure 1:
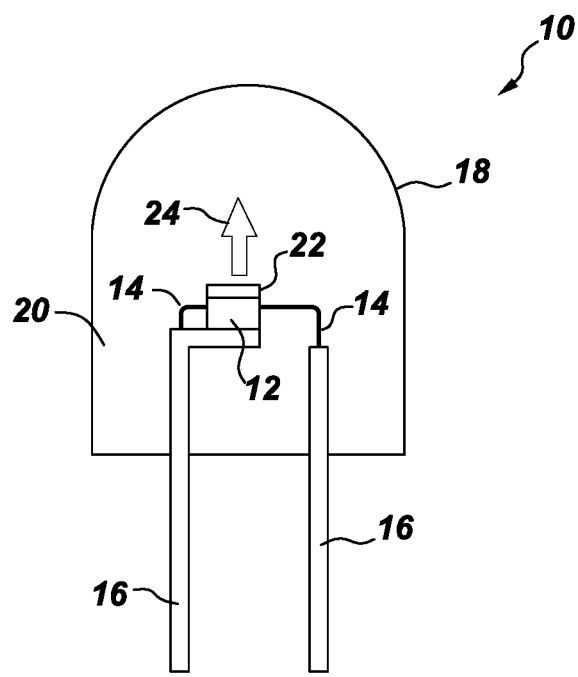
FIG. 1 is a schematic cross-sectional view of a device in accordance with one embodiment of the invention.

A lighting apparatus or light emitting assembly or lamp 10 according to one embodiment of the present invention is shown in FIG. 1. Lighting apparatus 10 includes a semiconductor radiation source, shown as light emitting diode (LED) chip 12, and leads 14 electrically attached to the LED chip. The leads 14 may be thin wires supported by a thicker lead frame(s) 16 or the leads may be self supported electrodes and the lead frame may be omitted. The leads 14 provide current to LED chip 12 and thus cause it to emit radiation.

The lamp may include any semiconductor blue or UV light source that is capable of producing white light when its emitted radiation is directed onto the phosphor. In one embodiment, the semiconductor light source is a blue emitting LED doped with various impurities. Thus, the LED may comprise a semiconductor diode based on any suitable III-V, II-VI or IV-IV semiconductor layers and having an emission wavelength of about 250 to 550 nm. In particular, the LED may contain at least one semiconductor layer comprising GaN, ZnSe or SiC. For example, the LED may comprise a nitride compound semiconductor represented by the formula In$_i$Ga$_j$Al$_k$N (where 0≤i; 0≤j; 0≤k and i+j+k=1) having an emission wavelength greater than about 250 nm and less than about 550 nm. In particular embodiments, the chip is a near-uv or blue emitting LED having a peak emission wavelength from about 400 to about 500 nm, particularly a uv-emitting LED having a peak emission wavelength about 405 nm or a blue-emitting LED having a peak emission wavelength about 450 nm. Such LED semiconductors are known in the art. The radiation source is described herein as an LED for convenience. However, as used herein, the term is meant to encompass all semiconductor radiation sources including, e.g., semiconductor laser diodes and organic light emitting diodes (OLED). Further, although the general discussion of the exemplary structures of the invention discussed herein is directed toward inorganic LED based light sources, it should be understood that the LED chip may be replaced, supplemented or augmented by another radiation source unless otherwise noted and that any reference to semiconductor, semiconductor LED, or LED chip is merely representative of any appropriate radiation source, including, but not limited to, laser diodes or OLEDs.

In lighting apparatus 10, phosphor composition 22 is radiationally coupled to the LED chip 12. Radiationally coupled means that the elements are associated with each other so radiation from one is transmitted to the other. Phosphor composition 22 includes at least one green emitting phosphor according to the present invention. In addition, red emitting Mn$^{4+}$ doped complex fluoride materials described in U.S. Pat. No. 7,358,542, U.S. Pat. No. 7,497,973, and U.S. Pat. No. 7,648,649 may also be included. The Mn$^{4+}$ doped complex fluorides are of formula A$_2$[M$^1$F$_6$]:Mn$^{4+}$, where A is Li, Na, K, Rb, Cs, or combinations thereof; and M$^1$ is Si, Ge, Sn, Ti, Zr, Al, Ga, In, Sc, Hf, Y, La, Nb, Ta, Bi, Gd, or combinations thereof. As used herein, the term "complex fluoride" refers to a coordination compound containing at least one coordination center, surrounded by fluoride ions acting as ligands, and charge-compensated by counter ions as necessary. For example, in the Mn$^{4+}$ doped complex fluoride of formula K$_2$SiF$_6$:Mn$^{4+}$, the coordination center is Si and the counter ion is K. Complex fluorides are occasionally written down as a combination of simple, binary fluorides but such a representation does not indicate the coordination number for the ligands around the coordination center. The square brackets (occasionally omitted for simplicity) indicate that the complex ion they encompass is a new chemical species, different from the simple fluoride ion. The activator ion (Mn$^{4+}$) also acts as a coordination center, substituting part of the centers of the host lattice, for example, Si. The host lattice (including the counter ions) may further modify the excitation and emission properties of the activator ion. In particular embodiments, the coordination center of the complex fluoride phosphors, that is, M in formula IV, is Si, Ge, Sn, Ti, Zr, or combinations thereof. More particularly, the coordination center is Si, Ge, Ti, or combinations thereof; the counter ion, that is, A in the formula, is Na, K, Rb, Cs, or combinations thereof. Examples of the complex fluoride phosphors include K$_2$[SiF$_6$]:Mn$^{4+}$, K$_2$[TiF$_6$]:Mn$^{4+}$, K$_2$[SnF$_6$]:Mn$^{4+}$, Cs$_2$[TiF$_6$]:Mn$^{4+}$, Rb$_2$[TiF$_6$]:Mn$^{4+}$, Cs$_2$[SiF$_6$]:Mn$^{4+}$, Rb$_2$[SiF$_6$]:Mn$^{4+}$, Na$_2$[TiF$_6$]:Mn$^{4+}$, Na$_2$[ZrF$_6$]:Mn$^{4+}$, or combinations thereof. In particular embodiments, the Me doped complex fluoride is K$_2$SiF$_6$:Mn$^{4+}$.

In some embodiments, the phosphor composition may further include a third phosphor to form a phosphor blend that produces white light from a lighting apparatus. For example, the phosphor blend may find application in a white light emitting LED-based device. In one embodiment, the third phosphor is a green emitting phosphor having a peak emission in a wavelength range from about 520 nanometers to about 580 nanometers. Suitable examples of the third phosphor include, but are not limited to, green emitting garnets (for example YAG), orthosilicates, beta-sialon, oxyhalides and combinations thereof.

Phosphor composition 22 is deposited on the LED 12 by any appropriate method. For example, a water based suspension of the phosphor(s) can be formed, and applied as a phosphor layer to the LED surface. In one such method, a silicone slurry in which the phosphor particles are randomly suspended is placed around the LED. This method is merely exemplary of possible positions of phosphor composition 22 and LED 12. Thus, phosphor composition 22 may be coated over or directly on the light emitting surface of the LED chip 12 by coating and drying the phosphor suspension over the LED chip 12. In the case of a silicone-based suspension, the suspension is cured at an appropriate temperature. Both the shell 18 and the encapsulant 20 should be transparent to allow white light 24 to be transmitted through those elements. Although not intended to be limiting, in some embodiments, the median particle size of the phosphor composition ranges from about 1 to about 50 microns, particularly from about 15 to about 35 microns.

In other embodiments, phosphor composition 22 is interspersed within the encapsulant material 20, instead of being formed directly on the LED chip 12. The phosphor (in the form of a powder) may be interspersed within a single region of the encapsulant material 20 or throughout the entire volume of the encapsulant material. Blue light emitted by the LED chip 12 mixes with the light emitted by phosphor composition 22, and the mixed light appears as white light. If the phosphor is to be interspersed within the material of encapsulant 20, then a phosphor powder may be added to a polymer or silicone precursor, loaded around the LED chip 12, and then the polymer precursor may be cured to solidify the polymer or silicone material. Other known phosphor interspersion methods may also be used, such as transfer loading.

In yet another embodiment, phosphor composition 22 is coated onto a surface of the shell 18, instead of being formed over the LED chip 12. The phosphor composition is preferably coated on the inside surface of the shell 18, although the phosphor may be coated on the outside surface of the shell, if desired. Phosphor composition 22 may be coated on the entire surface of the shell or only a top portion of the surface of the shell. The UV/blue light emitted by the LED chip 12 mixes with the light emitted by phosphor composition 22, and the mixed light appears as white light. Of course, the phosphor may be located in any two or all three locations or in any other suitable location, such as separately from the shell or integrated into the LED.

Figure 2:
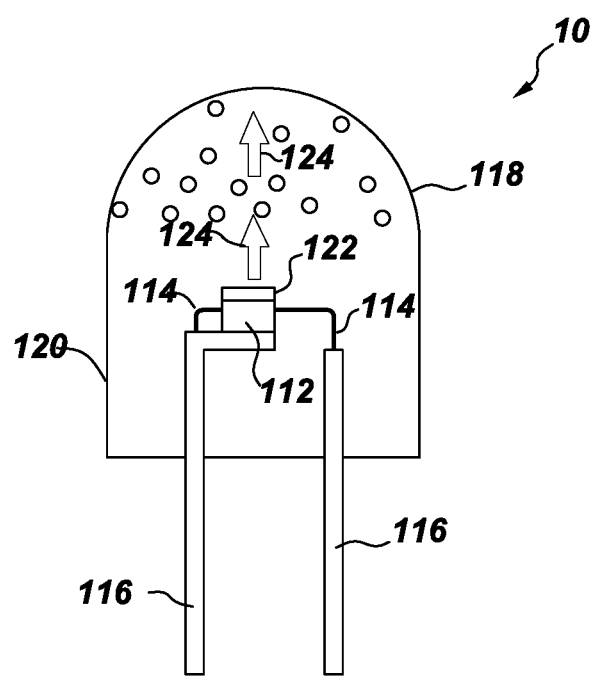
FIG. 2 is a schematic cross-sectional view of a device in accordance with another embodiment of the invention.

FIG. 2 illustrates a second structure of the system according to the present invention. Corresponding numbers from FIGS. 1-4 (e.g. 12 in FIGS. 1 and 112 in FIG. 2) relate to corresponding structures in each of the figures, unless otherwise stated. The structure of the embodiment of FIG. 2 is similar to that of FIG. 1, except that the phosphor composition 122 is interspersed within the encapsulant material 120, instead of being formed directly on the LED chip 112. The phosphor (in the form of a powder) may be interspersed within a single region of the encapsulant material or throughout the entire volume of the encapsulant material. Radiation (indicated by arrow 126) emitted by the LED chip 112 mixes with the light emitted by the phosphor 122, and the mixed light appears as white light 124. If the phosphor is to be interspersed within the encapsulant material 120, then a phosphor powder may be added to a polymer precursor, and loaded around the LED chip 112. The polymer or silicone precursor may then be cured to solidify the polymer or silicone. Other known phosphor interspersion methods may also be used, such as transfer molding.

Figure 3:
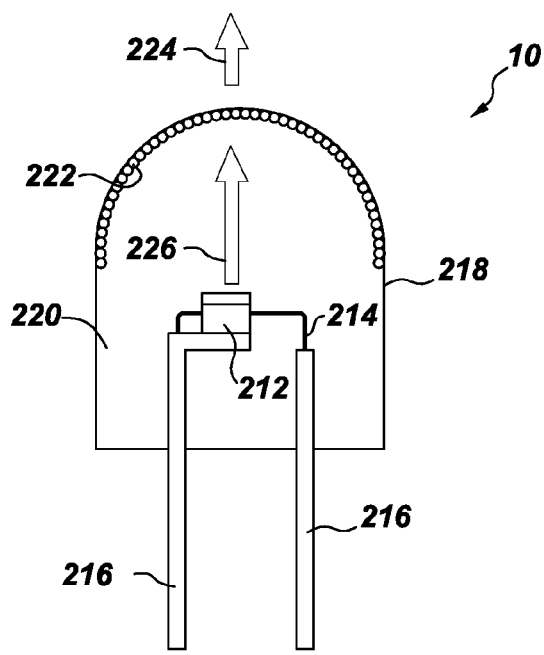
FIG. 3 is a schematic cross-sectional view of a device in accordance with yet another embodiment of the invention.

FIG. 3 illustrates a third possible structure of the system according to the present invention. The structure of the embodiment shown in FIG. 3 is similar to that of FIG. 1, except that the phosphor composition 222 is coated onto a surface of the envelope 218, instead of being formed over the LED chip 212. The phosphor composition 222 is preferably coated on the inside surface of the envelope 218, although the phosphor may be coated on the outside surface of the envelope, if desired. The phosphor composition 222 may be coated on the entire surface of the envelope, or only a top portion of the surface of the envelope. The radiation 226 emitted by the LED chip 212 mixes with the light emitted by the phosphor composition 222, and the mixed light appears as white light 224. Of course, the structures of FIGS. 1-3 may be combined, and the phosphor may be located in any two or all three locations, or in any other suitable location, such as separately from the envelope, or integrated into the LED.

In any of the above structures, the lamp may also include a plurality of scattering particles (not shown), which are embedded in the encapsulant material. The scattering particles may comprise, for example, alumina or titania. The scattering particles effectively scatter the directional light emitted from the LED chip, preferably with a negligible amount of absorption.

Figure 4:
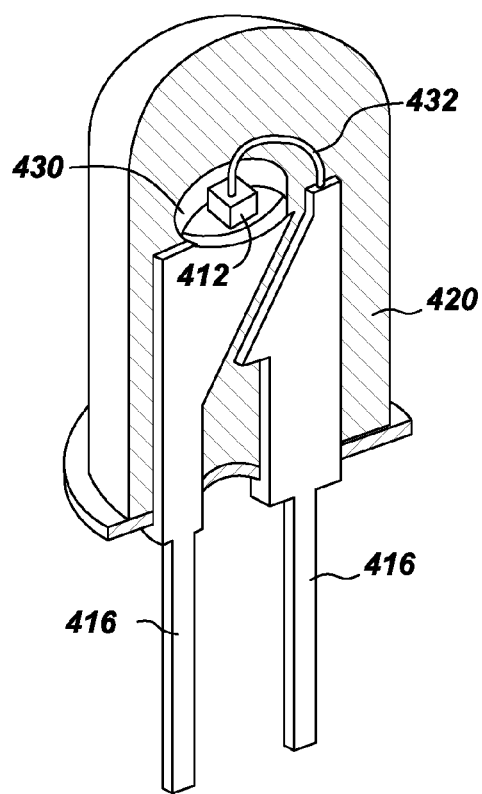
FIG. 4 is a cutaway side perspective view of a device in accordance with one embodiment of the invention.

As shown in a fourth structure in FIG. 4, the LED chip 412 may be mounted in a reflective cup 430. The cup 430 may be made from or coated with a dielectric material, such as alumina, titania, or other dielectric powders known in the art, or be coated by a reflective metal, such as aluminum or silver. The remainder of the structure of the embodiment of FIG. 4 is the same as those of any of the previous figures, and can include two leads 416, a conducting wire 432, and an encapsulant material 420. The reflective cup 430 is supported by the first lead 416 and the conducting wire 432 is used to electrically connect the LED chip 412 with the second lead 416.

Figure 5:
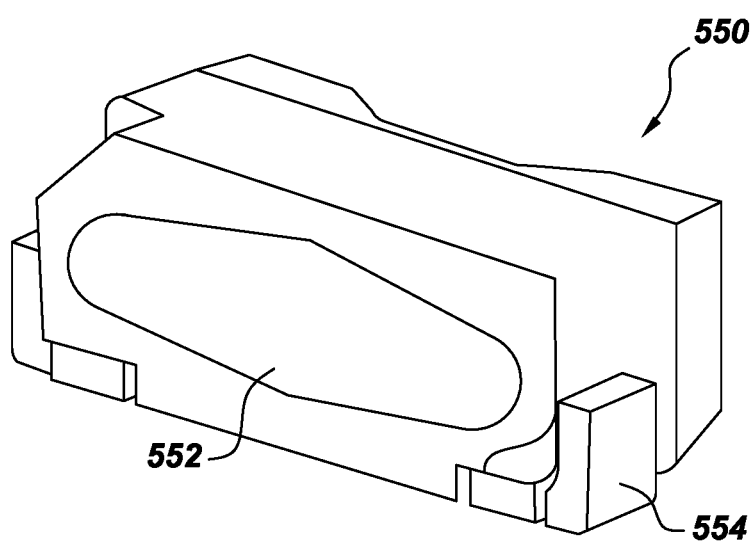
FIG. 5 is a schematic perspective view of a surface-mounted device (SMD) backlight LED.

Another structure (particularly for backlight applications) is a surface mounted device ("SMD") type light emitting diode 550, e.g. as illustrated in FIG. 5. This SMD is a "side-emitting type" and has a light-emitting window 552 on a protruding portion of a light guiding member 554. An SMD package may comprise an LED chip as defined above, and a phosphor material that is excited by the light emitted from the LED chip. Other backlight devices include, but are not limited to, TVs, computers, smartphones, tablet computers and other handheld devices that have a display including a semiconductor light source; and a green emitting oxyhalide phosphor according to the present invention.

When used with an LED emitting at from 350 to 550 nm and one or more other appropriate phosphors, the resulting lighting system will produce a light having a white color. Lamp 10 may also include scattering particles (not shown), which are embedded in the encapsulant material. The scattering particles may comprise, for example, alumina or titania. The scattering particles effectively scatter the directional light emitted from the LED chip, preferably with a negligible amount of absorption.

In addition to the green emitting phosphors according to the present invention and optionally, red emitting $Mn^{4+}$ doped phosphors, phosphor composition 22 may include one or more other phosphors. When used in a lighting apparatus in combination with a blue or near UV LED emitting radiation in the range of about 250 to 550 nm, the resultant light emitted by the assembly will be a white light. Other phosphors such as green, blue, yellow, red, orange, or other color phosphors may be used in the blend to customize the white color of the resulting light and produce specific spectral power distributions. Suitable phosphors for use in phosphor composition 22 include, but are not limited to:

$((Sr_{1-z}(Ca, Ba, Mg, Zn)_z)_{1-(x+w)}(Li, Na, K, Rb)_w Ce_x)_3 (Al_{1-y}Si_y)O_{4+y+3(x-w)}F_{1-y-3(x-w)}$, $0<x\leq10$, $0\leq y\leq0.5$, $0\leq z\leq0.5$, $0\leq w\leq x$;

$(Ca, Ce)_3Sc_2Si_3O_{12}(CaSiG)$;

$(Sr,Ca,Ba)_3Al_{1-x}Si_xO_{4+x}F_{1-x}:Ce^{3+}$ (SASOF));

$(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0\leq v\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+, Cl^-$; $ZnS:Cu^+, Al^{3+}$; $ZnS:Ag^+, Cl^-$; $ZnS:Ag^+, Al^{3+}$; $(Ba,Sr,Ca)_2Si_{1-\xi}O_{4-2\xi}:Eu^{2+}$ (wherein $0\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}, Ce^{3+}$; $SrY_2S_4:Eu^{2+}$; $CaLa_2S_4:Ce^{3+}$; $(Ba,Sr,Ca)MgP_2O_7:Eu^{2+}, Mn^{2+}$; $(Y,Lu)_2WO_6:Eu^{3+}, Mo^{6+}$; $(Ba,Sr,Ca)_\beta Si_\gamma N_\mu:Eu^{2+}$ (wherein $2\beta+4\gamma=3\mu$); $Ca_3(SiO_4)Cl_2:Eu^{2+}$; $(Lu,Sc,Y,Tb)_{2-u-v}Ce_vCa_{1+u}Li_wMg_{2-w}P_w(Si,Ge)_{3-w}O_{12-u/2}$ (where $-0.5\leq u\leq1$, $0<v\leq1.1$, and $0\leq w\leq0.2$); $(Y,Lu,Gd)_{2-\phi}Ca_\phi Si_4N_{6+\phi}C_{1-\phi}:Ce^{3+}$, (wherein $0\leq\phi\leq0.5$); (Lu,Ca,Li,Mg,Y), α-SiAlON doped with $Eu^{2+}$ and/or $Ce^{3+}$; $(Ca,Sr,Ba)SiO_2N_2:Eu^{2+},Ce^{3+}$; β-SiAlON:$Eu^{2+}$, $3.5MgO*0.5MgF_2*GeO_2:Mn^{4+}$; $Ca_{1-c-f}Ce_cEu_fAl_{1+c}Si_{1-c}N_3$, (where $0\leq c\leq0.2$, $0\leq f\leq0.2$); $Ca_{1-h-r}Ce_hEu_rAl_{1-h}(Mg,Zn)_hSiN_3$, (where $0\leq h\leq0.2$, $0\leq r\leq0.2$); $Ca_{1-2s-t}Ce_s(Li,Na)_sEu_tAlSiN_3$, (where $0\leq s\leq0.2$, $0\leq f\leq0.2$, $s+t>0$); (Sr, Ca)AlSiN$_3$:$Eu^{2+}$, $Ce^{3+}$; and $Ca_{1-o-\chi-\phi}Ce_o(Li,Na)_\chi Eu_\phi Al_{1+o-\chi}Si_{1-o+\chi}N_3$, (where $0\leq o\leq0.2$, $0\leq\chi\leq0.4$, $0\leq\phi\leq0.2$).

The ratio of each of the individual phosphors in the phosphor blend may vary depending on the characteristics of the desired light output. The relative proportions of the individual phosphors in the various embodiment phosphor blends may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.20 to about 0.55, and a y value in the range of about 0.20 to about 0.55. As stated, however, the exact identity and amounts of each phosphor in the phosphor composition can be varied according to the needs of the end user. For example, the material can be used for LEDs intended for liquid crystal display (LCD) backlighting. In this application, the LED color point would be appropriately tuned based upon the desired white, red, green, and blue colors after passing through an LCD/color filter combination.

Phosphor composition 22 may also include electroluminescent polymers such as polyfluorenes, preferably poly(9,9-dioctyl fluorene) and copolymers thereof, such as poly(9,9'-dioctylfluorene-co-bis-N,N'-(4-butylphenyl) diphenylamine) (F8-TFB); poly(vinylcarbazole) and polyphenylenevinylene and their derivatives. In addition, the light emitting layer may include a blue, yellow, orange, green or red phosphorescent dye or metal complex, a quantum dot material, or a combination thereof. Materials suitable for use as the phosphorescent dye include, but are not limited to, tris(1-phenylisoquinoline) iridium (III) (red dye), tris(2-phenylpyridine) iridium (green dye) and Iridium (III) bis(2-(4,6-difluorophenyl)pyridinato-N,C2) (blue dye). Commercially available fluorescent and phosphorescent metal complexes from ADS (American Dyes Source, Inc.) may also be used. ADS green dyes include ADS060GE, ADS061GE, ADS063GE, and ADS066GE, ADS078GE, and ADS090GE. ADS blue dyes include ADS064BE, ADS065BE, and ADS070BE. ADS red dyes include ADS067RE, ADS068RE, ADS069RE, ADS075RE, ADS076RE, ADS067RE, and ADS077RE. Exemplary quantum dot materials are based on CdSe, ZnS or InP, including, but not limited to, core/shell luminescent nanocrystals such as CdSe/ZnS, InP/ZnS, PbSe/PbS, CdSe/CdS, CdTe/CdS or CdTe/ZnS.

The green emitting phosphors of the present invention may be used in applications other than those described above. For example, the material may be used as a phosphor in a fluorescent lamp, in a cathode ray tube, in a plasma display device or in a liquid crystal display (LCD). The material may also be used as a scintillator in an electromagnetic calorimeter, in a gamma ray camera, in a computed tomography scanner or in a laser. These uses are merely exemplary and not limiting.

By use of the embodiments described in the present disclosure, particularly the phosphor compositions described herein, lamps can be provided producing white light having high red-green contrast, high luminosity, and high CRI values for a low range of color temperatures of interest (2500 K to 4000 K) for general illumination.

EXAMPLES

General Procedures

Silicone Tape Sample Preparation

Samples were prepared by mixing 500 mg of the material to be tested with 1.50 g silicone (Sylgard 184). The mixture was degassed in a vacuum chamber for about 15 minutes. The mixture (0.70 g) was poured into a disc-shaped template (28.7 mm diameter and 0.79 mm thick) and baked for 30 minutes at 90° C. The sample was cut into squares of size approximately 5 mm×5 mm for testing.

Stability Testing

High Light Flux Conditions

A laser diode emitting at 446 nm was coupled to an optical fiber with a collimator at its other end. The power output was 310 mW and the beam diameter at the sample was 700 microns. This is equivalent to a flux of 80 W/cm$^2$ on the sample surface. The spectral power distribution (SPD) spectrum that is a combination of the scattered radiation from the laser and the emission from the excited phosphor is collected with a 1 meter (diameter) integrating sphere and the data processed with the spectrometer software (Specwin). At intervals of two minutes, the integrated power from the laser and the phosphor emission were recorded over a period of about 21 hours by integrating the SPD from 400 nm to 500 nm and 550 nm to 700 nm respectively. The first 90 minutes of the measurement are discarded to avoid effects due to the thermal stabilization of the laser. The percentage of intensity loss due to laser damage is calculated as follows:

$$\text{Intensity loss}(\%) = 100 \frac{(\text{Power} - \text{Initial power})}{\text{Initial power}}$$

While only the emitter power from the phosphor is plotted, the integrated power from the laser emission as well as its peak position was monitored to ensure that the laser remained stable (variations of less than 1%) during the experiment.

High Temperature High Humidity (HHTH) Treatment

Samples for high temperature, high humidity (HTHH) treatment were made by mixing phosphor powders into a two-part methyl silicone binder (RTV-615, Momentive Performance Materials) in a ratio of 0.9 g phosphor to 0.825 g silicone (parts A+B). The phosphor/silicone mixture is then poured into aluminum sample holders and cured at 90° C. for 20 minutes. Control samples were stored under nitrogen, and samples for exposure to HTHH conditions were placed into a 85° C./85% RH controlled atmosphere chamber. These HTHH samples are periodically removed and their luminescence intensity under 450 nm excitation compared to that of the control samples.

Example 1

Phosphor Preparation: $Ba_3SiO_3Br_4:Eu^{2+}$

Materials: High purity barium carbonate ($BaCO_3$), silicon oxide ($SiO_2$), europium oxide ($Eu_2O_3$) (99.9%) and ammonium bromide ($NH_4Br$) (98%) were used without further purification. All the raw materials were sieved through 325 mesh. Amounts of raw materials are shown in Table 1.

TABLE 1

| Composition | $BaCO_3$, g | $Eu_2O_3$, g | $SiO_2$, g | $NH_4Br$, g | 1$^{st}$ fire temperature | 2$^{nd}$ fire temperature |
|---|---|---|---|---|---|---|
| $Ba_3SiO_3Br_4$ | 3.6522 | 0.0109 | 0.3920 | 2.4250 | 700 C. | 850 C. |

The powders were weighed into a plastic bottle, blended with yttria stabilized zirconia (YSG) media and ball milled for two hours. The blended powder was placed in an alumina crucible and fired at 700° C. for five hours under an atmosphere composed of 0.5% $H_2$/99.5% $N_2$. The fired powder was filtered through a 60 mesh sieve and re-blended for two hours, then re-fired at 850° C. under a 0.5% $H_2$/99.5% $N_2$ atmosphere. The product was sieved through 325 mesh screen.

An emission spectrum of the product is shown in FIG. 6. Peak emission wavelength was about 520 nm and FWHM was 100 nm.

Example 2

Phosphor Preparation: $Ba_5Si_3O_9Br_4:Eu^{2+}$

Materials: High purity barium carbonate ($BaCO_3$), silicon oxide ($SiO_2$), europium oxide ($Eu_2O_3$) (99.9%) and ammonium bromide ($NH_4Br$) (98%) were used without further purification. All the raw materials were sieved through 325 mesh. Amounts of raw materials are shown in Table 2.

TABLE 2

| Composition | $BaCO_3$, g | $Eu_2O_3$, g | $SiO_2$, g | $NH_4Br$, g | $1^{st}$ fire temperature | $2^{nd}$ fire temperature |
|---|---|---|---|---|---|---|
| $Ba_5Si_3O_9Br_4$ | 3.9880 | 0.0071 | 0.7695 | 1.5867 | 800 C. | 850 C. |

The powders were weighed into a plastic bottle, blended with yttria stabilized zirconia (YSG) media and ball milled for two hours. The blended powder was placed in an alumina crucible and fired at 800° C. for five hours under an atmosphere composed of 0.5% $H_2$/99.5% $N_2$. The fired powder was filtered through a 60 mesh sieve and re-blended for two hours, then re-fired at 850° C. under a 0.5% $H_2$/99.5% $N_2$ atmosphere. The product was sieved through 325 mesh screen.

An emission spectrum of the product is shown in FIG. 7. Peak emission wavelength was about 485 nm and FWHM was 88 nm.

Example 3

Phosphor Preparation: $Ca_5Si_3O_9Br_4:Eu^{2+}$

Materials: High purity calcium carbonate ($CaCO_3$), silicon oxide ($SiO_2$), europium oxide ($Eu_2O_3$) (99.9%) and ammonium bromide ($NH_4Br$) (98%) were used without further purification. All the raw materials were sieved through 325 mesh. Amounts of raw materials are shown in Table 3.

TABLE 3

| Composition | $CaCO_3$, g | $Eu_2O_3$, g | $SiO_2$, g | $NH_4Br$, g | $1^{st}$ fire temperature | $2^{nd}$ fire temperature |
|---|---|---|---|---|---|---|
| $Ca_5Si_3O_9Br_4$ | 3.3324 | 0.0117 | 1.2678 | 2.6142 | 600 C. | 700 C. |

The powders were weighed into a plastic bottle, blended with yttria stabilized zirconia (YSG) media and ball milled for two hours. The blended powder was placed in an alumina crucible and fired at 600° C. for five hours under an atmosphere composed of 0.5% $H_2$/99.5% $N_2$. The fired powder was filtered through a 60 mesh sieve and re-blended for two hours, then re-fired at 700° C. under a 0.5% $H_2$/99.5% $N_2$ atmosphere. The product was sieved through 325 mesh screen.

An emission spectrum of the product is shown in FIG. 8. Peak emission wavelength was about 435 nm and FWHM was 35 nm.

Example 4

Phosphor Preparation: $M_{1.64}Si_{0.82}O_{3.1}Br_{0.36}:Eu^{2+}$: (M=60:40 Ba:Sr)

Materials: High purity barium carbonate ($BaCO_3$), strontium carbonate ($SrCO_3$), silicon oxide ($SiO_2$), europium oxide ($Eu_2O_3$) (99.9%) and ammonium bromide ($NH_4Br$) (98%) were used without further purification. All the raw materials were sieved through 325 mesh. Amounts of raw materials are shown in Table 4.

TABLE 4

| Composition | $BaCO_3$, g | $SrCO_3$, g | $Eu_2O_3$, g | $SiO_2$, g | $NH_4Br$, g | $1^{st}$ fire temperature | $2^{nd}$ fire temperature |
|---|---|---|---|---|---|---|---|
| $M_{1.64}Si_{0.82}O_{3.1}Br_{0.36}$ | 3.2953 | 1.6184 | 0.0299 | 0.8813 | 0.5984 | 1100 C. | 1100 C. |

The powders were weighed into a plastic bottle, blended with yttria stabilized zirconia (YSG) media and ball milled for two hours. The blended powder was placed in an alumina crucible and fired at 1100° C. for five hours under an atmosphere composed of 0.5% $H_2$/99.5% $N_2$. The fired powder was filtered through a 60 mesh sieve and re-blended for two hours, then re-fired at 1100° C. under a 0.5% $H_2$/99.5% $N_2$ atmosphere. The product was sieved through 325 mesh screen.

An emission spectrum of the product is shown in FIG. 9. Peak emission wavelength was about 518 nm and FWHM was 60 nm.

Example 5

Phosphor Preparation: $Sr_{10}Si_3O_9Br_{14}:Eu^{2+}$

Materials: High purity strontium carbonate ($SrCO_3$), silicon oxide ($SiO_2$), europium oxide ($Eu_2O_3$) (99.9%) and ammonium bromide ($NH_4Br$) (98%) were used without further purification. All the raw materials were sieved through 325 mesh. Amounts of raw materials are shown in Table 5.

TABLE 5

| Composition | $SrCO_3$, g | $Eu_2O_3$, g | $SiO_2$, g | $NH_4Br$, g | $1^{st}$ fire temperature | $2^{nd}$ fire temperature |
|---|---|---|---|---|---|---|
| $Sr_{10}Si_3O_9Br_{14}$ | 3.3161 | 0.0040 | 0.4272 | 3.0833 | 500 C. | 600 C. |

The powders were weighed into a plastic bottle, blended with yttria stabilized zirconia (YSG) media and ball milled for two hours. The blended powder was placed in an alumina crucible and fired at 500° C. for five hours under an atmosphere composed of 0.5% $H_2$/99.5% $N_2$. The fired powder was filtered through a 60 mesh sieve and re-blended for two hours, then re-fired at 600° C. under a 0.5% $H_2$/99.5% $N_2$ atmosphere. The product was sieved through 325 mesh screen.

An emission spectrum of the product is shown in FIG. 10. Peak emission wavelength was about 428 nm and FWHM was 30 nm.

Example 6

Phosphor Preparation: $Sr_2SiO_3Br_2$:$Eu^{2+}$

Materials: High purity strontium carbonate ($SrCO_3$), silicon oxide ($SiO_2$), europium oxide ($Eu_2O_3$) (99.9%) and ammonium bromide ($NH_4Br$) (98%) were used without further purification. All the raw materials were sieved through 325 mesh. Amounts of raw materials are shown in Table 6.

TABLE 6

| Composition | $SrCO_3$, g | $Eu_2O_3$, g | $SiO_2$, g | $NH_4Br$, g | $1^{st}$ fire temperature | $2^{nd}$ fire temperature |
|---|---|---|---|---|---|---|
| $Sr_2SiO_3Br_2$ | 3.5673 | 0.0214 | 0.7690 | 2.3787 | 500 C. | 600 C. |

The powders were weighed into a plastic bottle, blended with yttria stabilized zirconia (YSG) media and ball milled for two hours. The blended powder was placed in an alumina crucible and fired at 500° C. for five hours under an atmosphere composed of 0.5% $H_2$/99.5% $N_2$. The fired powder was filtered through a 60 mesh sieve and re-blended for two hours, then re-fired at 600° C. under a 0.5% $H_2$/99.5% $N_2$ atmosphere. The product was sieved through 325 mesh screen.

An emission spectrum of the product is shown in FIG. 11. Peak emission wavelength was about 468 nm and FWHM was 85 nm.

The product of example 4 was subjected to stability testing under high temperature/high humidity and high light flux conditions, along with a commercial beta-SiAlON sample Results are shown in Table 7.

TABLE 7

| Example no. | conditions | Initial | 150 hr HTHH | 500 hr HTHH | Laser damage, % intensity loss |
|---|---|---|---|---|---|
| 4P1 | $N_2$ stored | 1.00 | 1.00 | 1.00 | 0 |
| 4P2 | Air stored | 1.00 | 1.03 | 1.05 | 0 |
| 4P3 | 85:85 | 1.00 | 0.97 | 1.04 | 0 |
| 4P4 | 85:85 | 1.00 | 1.01 | 1.02 | 0 |

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A device comprising a semiconductor light source and a $Eu^{2+}$ activated phosphor radiationally coupled to the light source;
wherein the phosphor is selected from
A. $M_3SiO_3X_4$:$Eu^{2+}$;
B. $M_5Si_3O_9X_4$:$Eu^{2+}$;
C. $M_{1.64}Si_{0.82}O_{3.1}X_{0.36}$:$Eu^{2+}$;
D. $M_{10}Si_3O_9X_{14}$:$Eu^{2+}$;
E. $M_2SiO_3X_2$:$Eu^{2+}$; and
wherein
M is Ba, Ca, Sr, or a mixture thereof;
X is Br, or a mixture of Br and Cl.

2. A device according to claim 1, wherein the phosphor is $M_3SiO_3X_4$:$Eu^{2+}$.

3. A device according to claim 1, wherein the phosphor is $M_5Si_3O_9X_4$:$Eu^{2+}$.

4. A device according to claim 1, wherein the phosphor is $M_{1.64}Si_{0.82}O_{3.1}X_{0.36}$:$Eu^{2+}$.

5. A device according to claim 1, wherein the phosphor is $M_{10}Si_3O_9X_{14}$:$Eu^{2+}$.

6. A device according to claim 1, wherein the phosphor is $M_2SiO_3X_2$:$Eu^{2+}$.

7. A device according to claim 1, wherein the phosphor is selected from
$Ba_3SiO_3Br_4$:$Eu^{2+}$;
$Ba_5Si_3O_9Br_4$:$Eu^{2+}$;
$Ca_5Si_3O_9Br_4$:$Eu^{2+}$;
$Ba_{0.984}Sr_{0.656}Si_{0.82}O_{3.1}Br_{0.36}$: $EU^{2+}$;
$Sr_{10}Si_3O_9Br_{14}$:$Eu^{2+}$; and
$Sr_2SiO_3Br_2$:$Eu^{2+}$.

8. A device according to claim 1, additionally comprising a $Mn^{4+}$-doped phosphor of formula I $$A_x[M^1F_y]:Mn^{4+} \qquad I$$

wherein
A is Li, Na, K, Rb, Cs, or a combination thereof;
$M^1$ is Si, Ge, Sn, Ti, Zr, Al, Ga, In, Sc, Y, La, Nb, Ta, Bi, Gd, or a combination thereof;
x is the absolute value of the charge of the $[M^2F_y]$ ion; and
y is 5, 6 or 7.

9. A device according to claim 8, wherein the $Mn^{4+}$-doped phosphor of formula I is $K_2SiF_6$: $Mn^{4+}$.

10. A backlight unit comprising a device according to claim 1.

11. An electronic device comprising a backlight unit according to claim 1.

12. A lighting apparatus comprising a device according to claim 1.

13. A $Eu^{2+}$ activated phosphor selected from the group consisting of
A. $M_3SiO_3X_4$:$Eu^{2+}$;
B. $M_5Si_3O_9X_4$:$Eu^{2+}$;
C. $M_{1.64}Si_{0.82}O_{3.1}X_{0.36}$:$Eu^{2+}$;
D. $M_{10}Si_3O_9X_{14}$:$Eu^{2+}$;
E. $M_2SiO_3X_2$:$Eu^{2+}$; and
wherein
M is Ba, Ca, Sr, or a mixture thereof;
X is Br, or a mixture of Br and Cl.

14. A $Eu^{2+}$ activated phosphor according to claim 13, of formula $M_3SiO_3X_4$:$Eu^{2+}$.

15. A $Eu^{2+}$ activated phosphor according to claim 13, of formula $M_5Si_3O_9X_4$:$Eu^{2+}$.

16. A $Eu^{2+}$ activated phosphor according to claim 13, of formula $M_{1.64}Si_{0.82}O_{3.1}X_{0.36}$:$Eu^{2+}$.

17. A $Eu^{2+}$ activated phosphor according to claim 13, of formula $M_{10}Si_3O_9X_{14}$:$Eu^{2+}$.

18. A $Eu^{2+}$ activated phosphor according to claim 13, of formula $M_2SiO_3X_2$:$Eu^{2+}$.

19. A $Eu^{2+}$ activated phosphor according to claim 13, selected from $Ba_3SiO_3Br_4:Eu^{2+}$;
$Ba_5Si_3O_9Br_4:Eu^{2+}$;
$Ca_5Si_3O_9Br_4:Eu^{2+}$.
$Ba_{0.984}Sr_{0.656}Si_{0.82}O_{3.1}Br_{0.36}:EU^{2+}$;
$Sr_{10}Si_3O_9Br_{14}:Eu^{2+}$; and
$Sr_2SiO_3Br_2:Eu^{2+}$.

20. A $Eu^{2+}$ activated phosphor produced by combining from about 3.2 parts to about 3.4 parts $Ba\,CO_3$,
from about 1.5 to about 1.7 parts $SrCO_3$,
from about 0.87 to about 0.89 parts $SiO_2$, from about 0.02 to about 0.15 parts $Eu_2O_3$ and
from about 0.54 to about 0.62 parts $NH_4Br$; and in a first firing step, firing the combination at a temperature ranging from about 800° C. to about 1300° C. under a reducing atmosphere to form an intermediate product; and in a second firing step, firing the intermediate product at a temperature ranging from about 800° C. to about 1300° C. under the reducing atmosphere.

21. A $Eu^{2+}$ activated phosphor according to claim 20, wherein in the first firing step, the combination is fired at about 1100° C.; and in the second firing step, the intermediate product is fired at about 1100° C.

* * * * *